(12) United States Patent
Yeh et al.

(10) Patent No.: US 7,514,742 B2
(45) Date of Patent: Apr. 7, 2009

(54) RECESSED SHALLOW TRENCH ISOLATION

(75) Inventors: Chih Chieh Yeh, Taipei (TW); Wen Jer Tsai, Hualien (TW)

(73) Assignee: Macronix International Co., Ltd., Hsinchu (TW)

( * ) Notice: Subject to any disclaimer, the term of this patent is extended or adjusted under 35 U.S.C. 154(b) by 418 days.

(21) Appl. No.: 11/249,228

(22) Filed: Oct. 13, 2005

(65) Prior Publication Data

US 2007/0087523 A1    Apr. 19, 2007

(51) Int. Cl.
*H01L 27/108* (2006.01)
(52) U.S. Cl. .................. 257/326; 257/314; 438/435
(58) Field of Classification Search .......... 257/314, 257/524, 305, 326, E21.54; 438/435
See application file for complete search history.

(56) References Cited

U.S. PATENT DOCUMENTS

| | | | |
|---|---|---|---|
| 5,768,192 A | 6/1998 | Eitan et al. | |
| 6,342,451 B1 | 1/2002 | Ahn | |
| 6,509,232 B1 * | 1/2003 | Kim et al. | 438/264 |
| 6,674,132 B2 | 1/2004 | Willer | |
| 6,818,511 B2 | 11/2004 | Lee | |
| 2001/0031540 A1 | 10/2001 | Lim et al. | |
| 2004/0145007 A1 * | 7/2004 | Sumino et al. | 257/315 |
| 2005/0287731 A1 * | 12/2005 | Bian et al. | 438/201 |
| 2006/0178020 A1 * | 8/2006 | Hoshi et al. | 438/789 |

OTHER PUBLICATIONS

Ya-Chin King et al. "Charge-Trap Memory Device Fabricated by Oxidation of $Si_{1-x}Ge_x$," IEEE Transactions on Electron Devices, vol. 48, No. 4, Apr. 2001, pp. 696-700.
Jing Hao Chen et al. "Nonvolatile Flash Memory Device Using Ge Nanocrystals Embedded in HfAlO High-k Tunneling and Control Oxides: Device Fabrication and Electrical Performance" IEEE Transactions on Electron Devices, vol. 51, No. 11, Nov. 2004, pp. 1840-1848.
Leo Mathew et al. "Multiple Independent Gate Field Effect Transistors—Device, Process, Applications" Freescale Semiconductors Inc., ECS SOI Conference, Jun. 2005, consisting of 10 pages.
U.S. Appl. No. 10/973,176, filed Oct. 26, 2004, "Method and Apparatus for Operating a String of Charge Trapping Memory Cells", by Chih Chieh Yeh, 49 pages.

* cited by examiner

*Primary Examiner*—Bradley K Smith
(74) *Attorney, Agent, or Firm*—Kenta Suzue; Haynes Beffel & Wolfeld LLP

(57) ABSTRACT

In some embodiments, a memory integrated circuit has different shallow trench isolation structures in the memory circuitry of the memory integrated circuit and the control circuitry of the memory integrated circuit. The isolation dielectric fills the trenches of the shallow trench isolation structures to different degrees.

In some embodiments, a memory integrated circuit has memory circuitry with shallow trench isolation structures and intermediate regions. The memory circuitry supports a channel between neighboring nonvolatile memory devices supporting multiple current components with different orientations.

In some embodiments, recessed shallow trench isolation structures are formed.

17 Claims, 12 Drawing Sheets

RECESSED SHALLOW TRENCH ISOLATION

BACKGROUND OF THE INVENTION

1. Field of the Invention

The present invention relates to electrically programmable and erasable non-volatile memory, and more particularly to nonvolatile memory with recessed shallow trench isolation structures.

2. Description of Related Art

Electrically programmable and erasable non-volatile memory technologies based on charge storage structures known as EEPROM and flash memory are used in a variety of modem applications. A number of memory cell structures are used for EEPROM and flash memory. As the overall dimensions of integrated circuits shrink, the memory cell dimensions shrink, including the channel width. Such device scaling therefore reduces the magnitude of the read current. Reduced read current causes the degradation in the read access time, which is a critical performance parameter of memory.

Thus, a need exists for a nonvolatile memory cell that can be reduce the performance degradation which results from continued scaling of nonvolatile memory devices to smaller dimensions.

SUMMARY OF THE INVENTION

Various embodiments include a memory integrated circuit that has different shallow trench isolation structures. A first type of shallow trench isolation structures with trenches that are filled incompletely with isolation dielectric is found in the memory circuitry of the memory integrated circuit. For example, the isolation dielectric filling the trenches is characterized by a range of depths from top edges of the trenches down to the isolation dielectric.

A second type of shallow trench isolation structures with trenches that are filled more completely with isolation dielectric than the first type is found in the control circuitry of the memory integrated circuit. The degree to which the isolation dielectric more completely fills the trenches varies with different embodiments. For example, in one embodiment the isolation dielectric fills the trenches completely. In another example, the isolation dielectric filling the trenches is characterized by another range of depths from top edges of the trenches down to the isolation dielectric, with an average of this range of depths being shallower compared to an average of the first type of shallow trench isolation structures. In yet another example of the second type of shallow trench isolation structures, some of the isolation dielectric fills the trenches completely, and some of the isolation dielectric is characterized by another range of depths from top edges of the trenches down to the isolation dielectric.

In some embodiments, the memory circuitry has nonvolatile memory structures at least partly fill the memory circuitry trenches, such as charge storage structures, sources of gate voltage, dielectric structures between the charge storage structures and the substrate region and between the charge storage structures. Various embodiments have different nonvolatile memory organizations, such as virtual ground arrays, NOR arrays, NAND arrays, and strings of nonvolatile memory cells.

In some embodiments with the memory circuitry including nonvolatile memory structures that form nonvolatile memory devices, the control circuitry measures a current component flowing between a substrate region and a current terminal in the memory devices to read data in the memory devices. For example, the control circuitry induces a band-to-band current component in the memory devices to read data in the memory devices.

Various embodiments of a memory integrated circuit include memory circuitry with shallow trench isolation structures and intermediate regions between the memory circuitry trenches, both oriented along a common direction of a substrate. The isolation dielectric of the shallow trench isolation structures fills the trenches incompletely. The intermediate regions between the memory circuitry trenches have nonvolatile memory structures.

The memory circuitry supports a channel between neighboring nonvolatile memory devices sharing a common intermediate region between shallow trench isolation structures. The channel supports multiple current components with different orientations. One current component has an orientation defined by a trench of a shallow trench isolation structure adjacent to the common intermediate region. Another current component has another orientation defined by a surface of the common intermediate region between shallow trench isolation structures. Because the channel supports the additional current component having an orientation defined by a trench of a shallow trench isolation structure, higher magnitudes of current flow are supported by this memory integrated circuit, compensating for decreasing feature size and the correspondingly decreasing magnitudes of current flow defined by the surface of the common intermediate region between shallow trench isolation structures.

The nonvolatile memory structures can be strings of nonvolatile memory structures, for example oriented along the common direction of the substrate also characterizing the orientation of the shallow trench isolation structures and the orientation of the intermediate regions between the memory circuitry trenches.

Some embodiments have control circuitry coupled to the memory circuitry. In one embodiment, neighboring control devices of the control circuitry with only a single orientation of current component. In some embodiments, the control circuitry measures a current component flowing between a substrate region and a current terminal in the. memory devices to read data in the memory devices. For example, the control circuitry induces a band-to-band current component in the memory devices to read data in the memory devices.

Various embodiments of semiconductor manufacturing method form shallow trench isolation structures described herein. Shallow trench isolation structures are formed different regions of the wafer, such as regions of the wafer allotted to memory devices and regions of the wafer allotted to control circuitry.

Shallow trench isolation structures are formed on regions of the wafer allotted to memory devices, by: forming trenches of the shallow trench isolation structures, depositing isolation dielectric into the trenches and onto intermediate regions between the trenches, removing the isolation dielectric until at least the isolation dielectric covering the intermediate regions is removed, and then at least partly removing additional isolation dielectric from the trenches in at least the regions of the wafer allotted to memory devices. The method can further include implanting at least part of the intermediate regions.

Shallow trench isolation structures are formed similarly on regions of the wafer allotted to control circuitry, such that the shallow trench isolation structures are formed differently in regions of the wafer allotted to memory devices and regions of the wafer allotted to control circuitry. For example, after removing the isolation dielectric until the isolation dielectric covering the intermediate regions is removed from the regions of the wafer allotted to control circuitry, additional isolation dielectric is not removed from the trenches.

Some embodiments of the method include forming nonvolatile memory devices, such as strings of nonvolatile memory devices.

In some embodiments, top edges of the trenches of the shallow trench isolation structures are tapered or rounded, thereby easing stress in the films.

Other aspects and advantages of the technology presented herein can be understood with reference to the figures, the detailed description and the claims, which follow.

DETAILED DESCRIPTION

FIGS. 1A-1H illustrate a process of forming recessed shallow trench isolation structures.

Figure 1A:
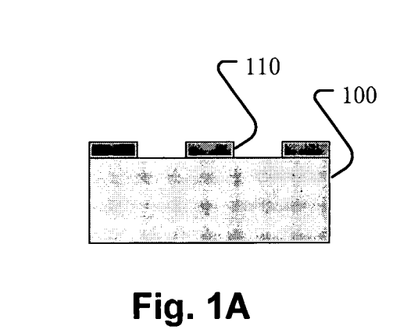
FIGS. 1A-1H illustrate a process of forming recessed shallow trench isolation structures.

In FIG. 1A, a silicon nitride structure 110 is formed on substrate 100, typically silicon. The silicon nitride structure 110 is grown on a pad oxide serving as stress relief between the silicon substrate 100 and the silicon nitride structure 110 if there would otherwise be too great of a lattice mismatch or other mechanical stress. The silicon nitride structure acts as a diffusion barrier during later oxide growth.

Figure 1B:
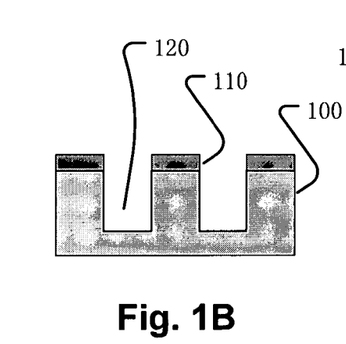

In FIG. 1B, trenches 120 are formed in the silicon substrate 100 by etching the substrate 100. These trenches 120 are formed after coating the surface with photoresist, and exposing the photoresist with a mask that defines the pattern of the shallow trench isolation structures. The photoresist is stripped and cleaned.

Figure 1C:
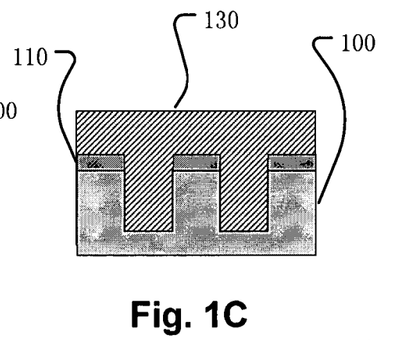

In FIG. 1C, the trenches are filled with oxide. This follows the growth of thermal oxide on the trench sidewalls to serve as a barrier oxide. The oxide is deposited also on the regions between the trenches, on the silicon nitride structure 110. The oxide deposition is performed via CVD (chemical vapor deposition) such as HDP (high density plasma deposition). Alternatively, SOG (spin on glass) followed by annealing can form the oxide.

Figure 1D:
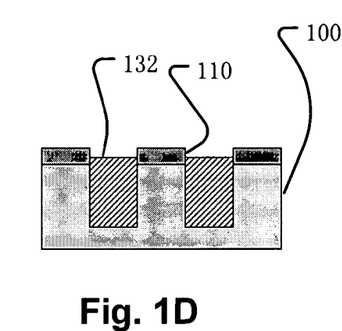

In FIG. 1D, the surface of the isolation oxide is smoothed with CMP (chemical mechanical polishing) of the oxide. The remaining isolation oxide 132 has a smooth surface. At this point, oxide which was deposited on the regions between the trenches, on the silicon nitride structure 110, is removed. The smoothing is useful following the CVD oxide deposition, which left a non-uniform wafer surface. Alternatively, if SOG (spin on glass) followed by annealing forms the oxide, then the wafer surface is relatively uniform, and the smoothing step can be omitted. The surface level of the oxide may be reduced below the surface level of the silicon nitride structure 110 due to over-polishing, which can be controlled or removed by adjusting the CMP time or the overall recipe.

Figure 1E:
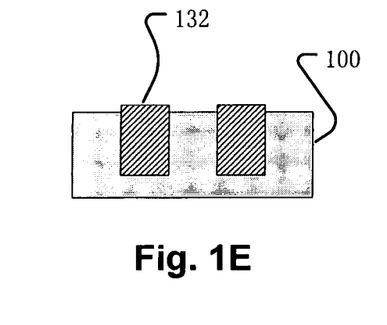

In FIG. 1E, the silicon nitride structure which acted as a diffusion barrier during oxide growth is removed. The pad oxide is also removed.

Figure 1F:
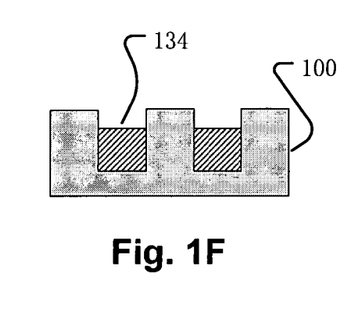

In FIG. 1F, part of the oxide in the trenches is removed. The remaining oxide 134 is recessed in the trench. Wet etch and/or dry etch can be used. The depth of the recess from the top edge of the trench down to the oxide is about 5 nm to 200 nm. On embodiment has a depth of about 50 nm. An appropriate depth can be dictated by the junction depth of the source and drain.

Figure 1G:
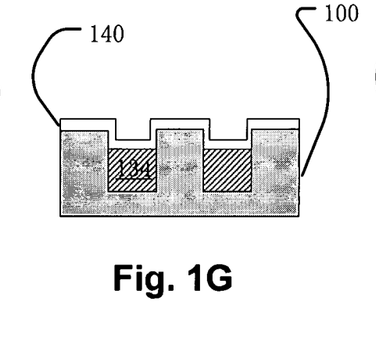

In FIG. 1G, nonvolatile memory structures 140 are formed. The nonvolatile memory structures include charge storage structures and oxide structures.

Figure 1H:
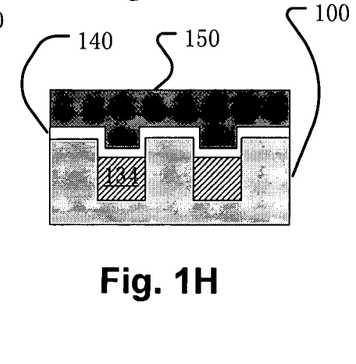

In FIG. 1H, the word lines 150 are formed. The word lines 150 are formed by polysilicon and/or metal silicide.

Figure 2:
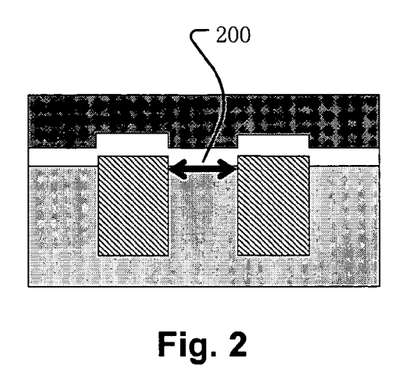
FIG. 2 is a simplified diagram of a cross-section of recessed shallow trench isolation structures that support a current channel with current flow of one orientation.

FIG. 2 is a simplified diagram of a cross-section of recessed shallow trench isolation structures that support a current channel with current flow of one orientation. This type of shallow trench isolation structure is used in the regions of the wafer allotted to control circuitry. The arrow 200 shows the orientation of current flowing in a current channel between neighboring devices, into/out of the page. This orientation of current is defined by a surface of the intermediate region between two shallow trench isolation structures.

Figure 3:
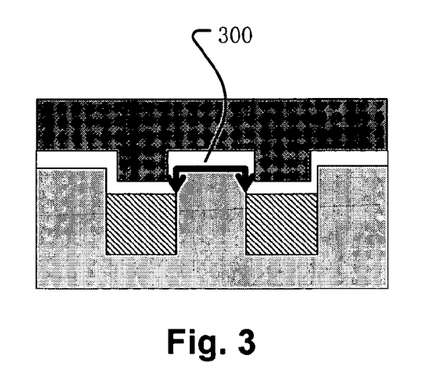
FIG. 3 is a simplified diagram of a cross-section of recessed shallow trench isolation structures that support a current channel with current flow of multiple orientations.

FIG. 3 is a simplified diagram of a cross-section of recessed shallow trench isolation structures that support a current channel with current flow of multiple orientations. This type of shallow trench isolation structure is used in the regions of the wafer allotted to control circuitry. The arrow 300 shows the orientations of current flowing in a current channel between neighboring devices, into/out of the page. Compared to FIG. 2, there is an additional orientation of current defined by the adjacent trenches of adjacent shallow trench isolation structures. After the intermediate region between-two regions is implanted to be n+ or p+, the entire intermediate region can support an inversion. There is also a relatively close distance between the portion of the intermediate region capable of supporting an inversion along the additional orientation, and the word line material providing a gate voltage. This is in contrast with FIG. 2, where the word line material is relatively far from portions of the intermediate region capable of supporting an inversion along any additional orientations.

Figure 4:
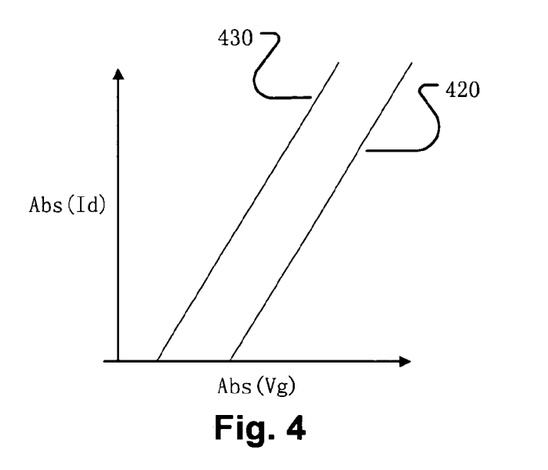
FIG. 4 is a simple graph comparing the voltage vs. current traces supported by recessed shallow trench isolation structures that support a current channel with current flow of one orientation and multiple orientations.

FIG. 4 is a simple graph comparing the voltage vs. current traces supported by recessed shallow trench isolation structures that support a current channel with current flow of one orientation and multiple orientations. Trace 420 corresponds to shallow trench isolation structures that support a current channel with current flow of one orientation, as in FIG. 2. Trace 430 corresponds to shallow trench isolation structures that support a current channel with current flow of multiple orientations, as in FIG. 3. Because of the additional current flow orientation associated with trace 430, for a given gate voltage Vg, the magnitude of drain current Id is higher for trace 430 than for trace 420. The additional flow orientations result in an effectively larger channel width, accounting for the extra current. The slope of the curves is determined by the electrical field from the gate.

Figure 5:
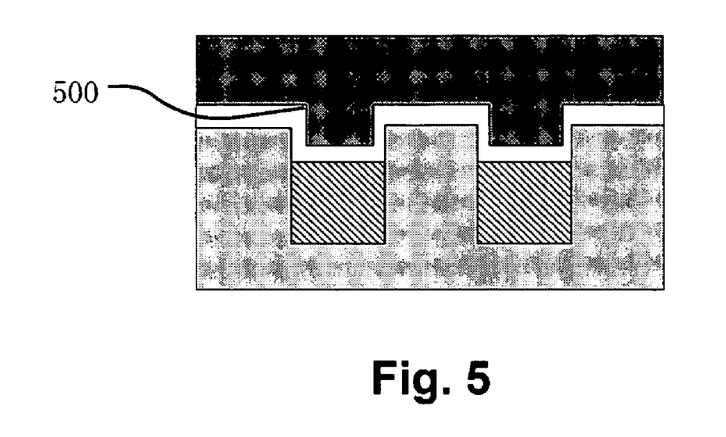
FIGS. 5-7 are simplified diagrams of cross-sections of alternate recessed shallow trench isolation structures that support a current channel with current flow of multiple orientations.
Figure 6:
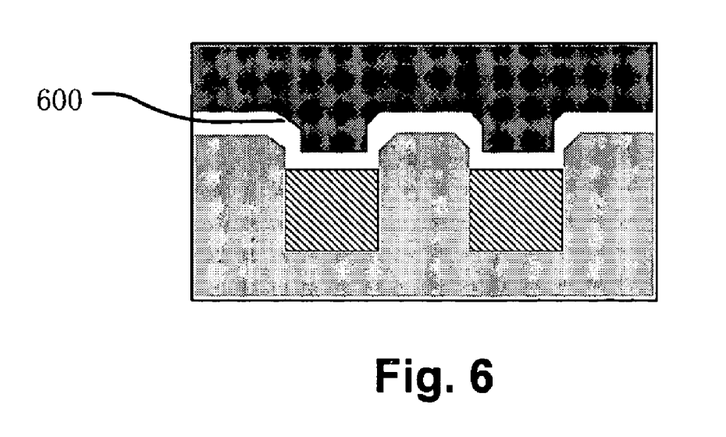
Figure 7:
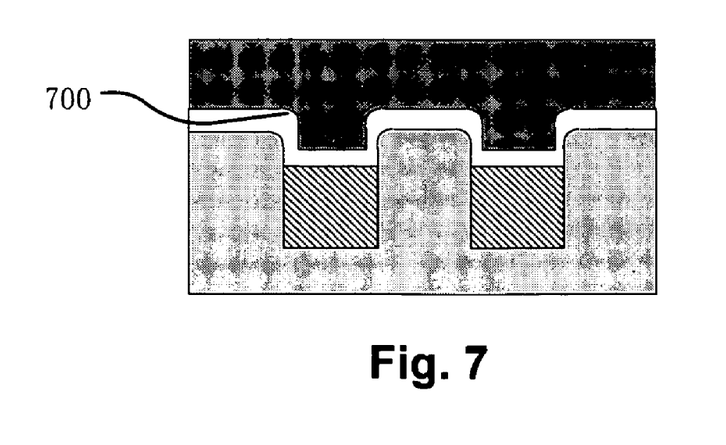

FIGS. 5-7 are simplified diagrams of cross-sections of alternate recessed shallow trench isolation structures that support a current channel with current flow of multiple orientations. In FIG. 5, the top edges of the trenches of the shallow trench isolation structures are sharp. In FIG. 6, the top edges of the trenches of the shallow trench isolation structures are tapered. In FIG. 7, the top edges of the trenches of the shallow trench isolation structures are rounded. The alternative profiles are made by slight etching, as the corner etching speed is faster than planar etching speed. A little ion bombardment can be also used to bombard and remove the corners. After the oxide recess step, an isotropic etch can be used to realize a rounded corner.

FIGS. 8-12 show memory operations performed on strings of nonvolatile memory cells. The strings of nonvolatile memory cells shown in FIGS. 8-12 are formed with recessed shallow trench isolation structures. The actual nonvolatile memory cells are formed on the intermediate regions between shallow trench isolation structures. Because the strings are formed with recessed shallow trench isolation structures, the channel between two neighboring nonvolatile memory cells in the same string supports current flow with multiple orientations.

Figure 8:
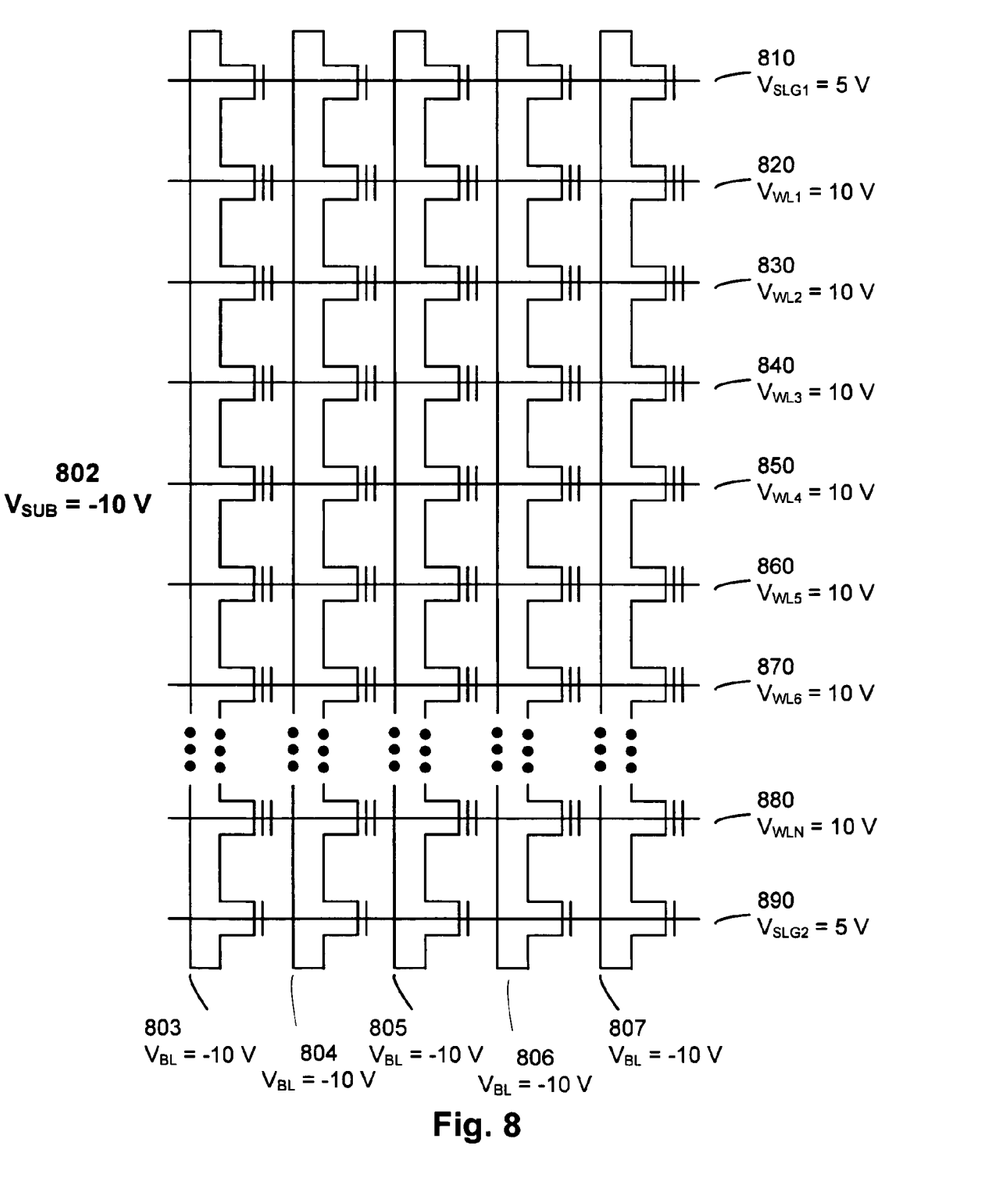
FIG. 8 is a simplified diagram of an array of charge trapping memory cells, showing another erase operation being performed on the memory array.

In FIG. 8, an array of memory cells is erased, with multiple strings each including N memory cells coupled in series. The voltage of the substrate 802 is −10 V. The word lines of the memory cells to be erased 820, 830, 840, 850, 860, 870, and 880 have a voltage of 10 V. The word lines of pass transistors 810 and 890 have a voltage of 5 V. The bit lines 803, 804, 805, 806, and 807 have a voltage of −10 V. The memory cells of the array are erased, for example via FN tunneling of electrons from the substrate (including drain and source) to the charge trapping structure and from the charge trapping structure to the gate.

Figure 9:
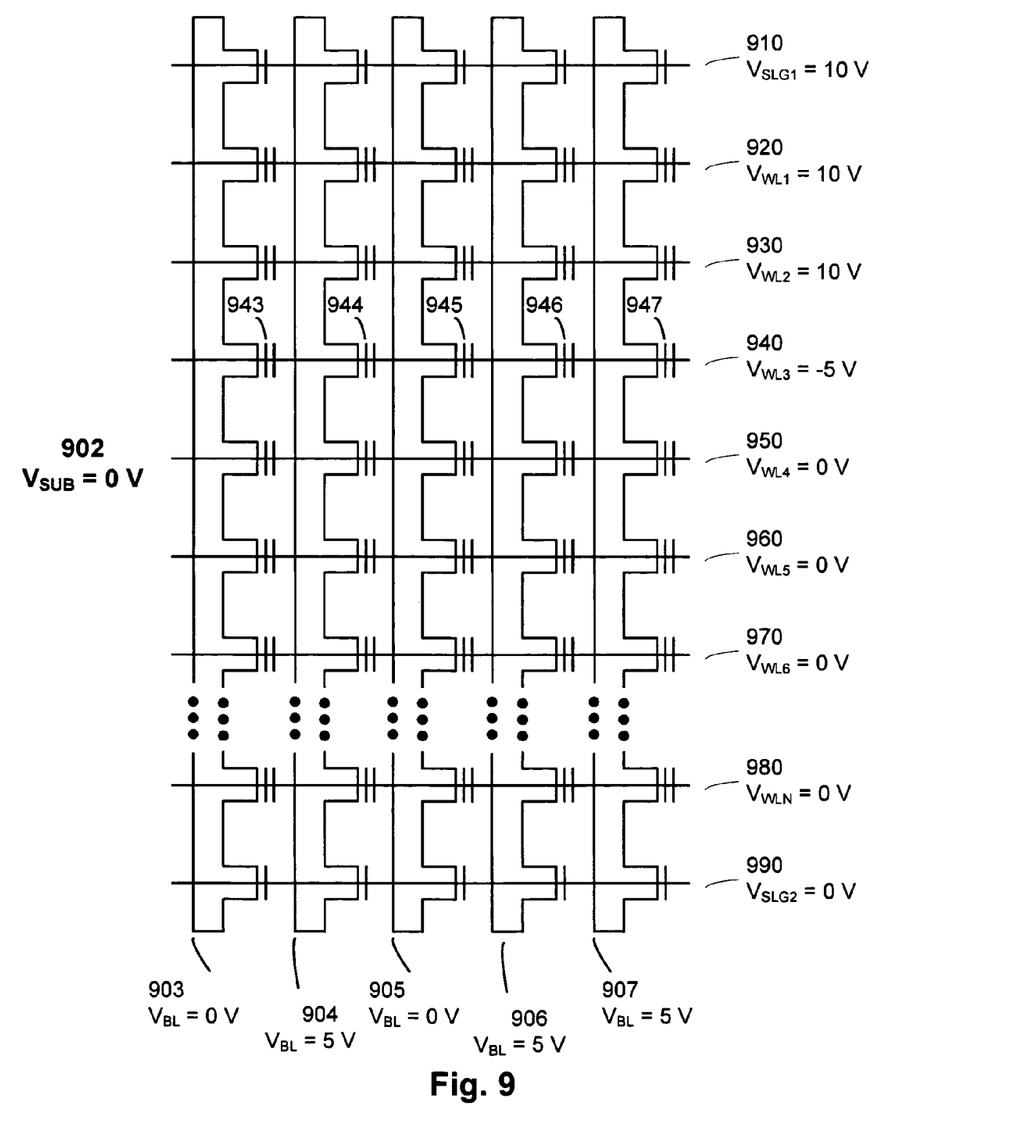
FIG. 9 is a simplified diagram of an array of charge trapping memory cells, showing a program operation being performed on one portion of selected cells of the memory array.

In FIG. 9, several memory cells are programmed in an array of memory cells with multiple strings each including N memory cells coupled in series. The voltage of the substrate 902 is 0 V. The word line 940 of the memory cells to be programmed has a voltage of −5 V. With the memory cells selected by the word line 940, the charge trapping structure parts 943, 944, 945, 946, and 947 are selected by turning on the pass transistor word line 910 with a voltage of 10 V. The voltages of the intervening memory cell word lines 920 and 930 is set to 10 V. The other pass transistor word line 990 and the remaining memory cell word lines 950, 960, 970, and 980 are turned off with a voltage of 0 V. Out of the selected charge trapping structure parts 943, 944, 945, 946, and 947, the charge trapping structure parts 944, 946, and 947 are programmed by setting the voltages of the bit lines 904, 906, and 907 to 5 V. Out of the selected charge trapping structure parts 943, 944, 945, 946, and 947, the charge trapping structure parts 943 and 945 are not programmed, by setting the voltages of the bit lines 903 and 905 to 0 V.

Figure 10:
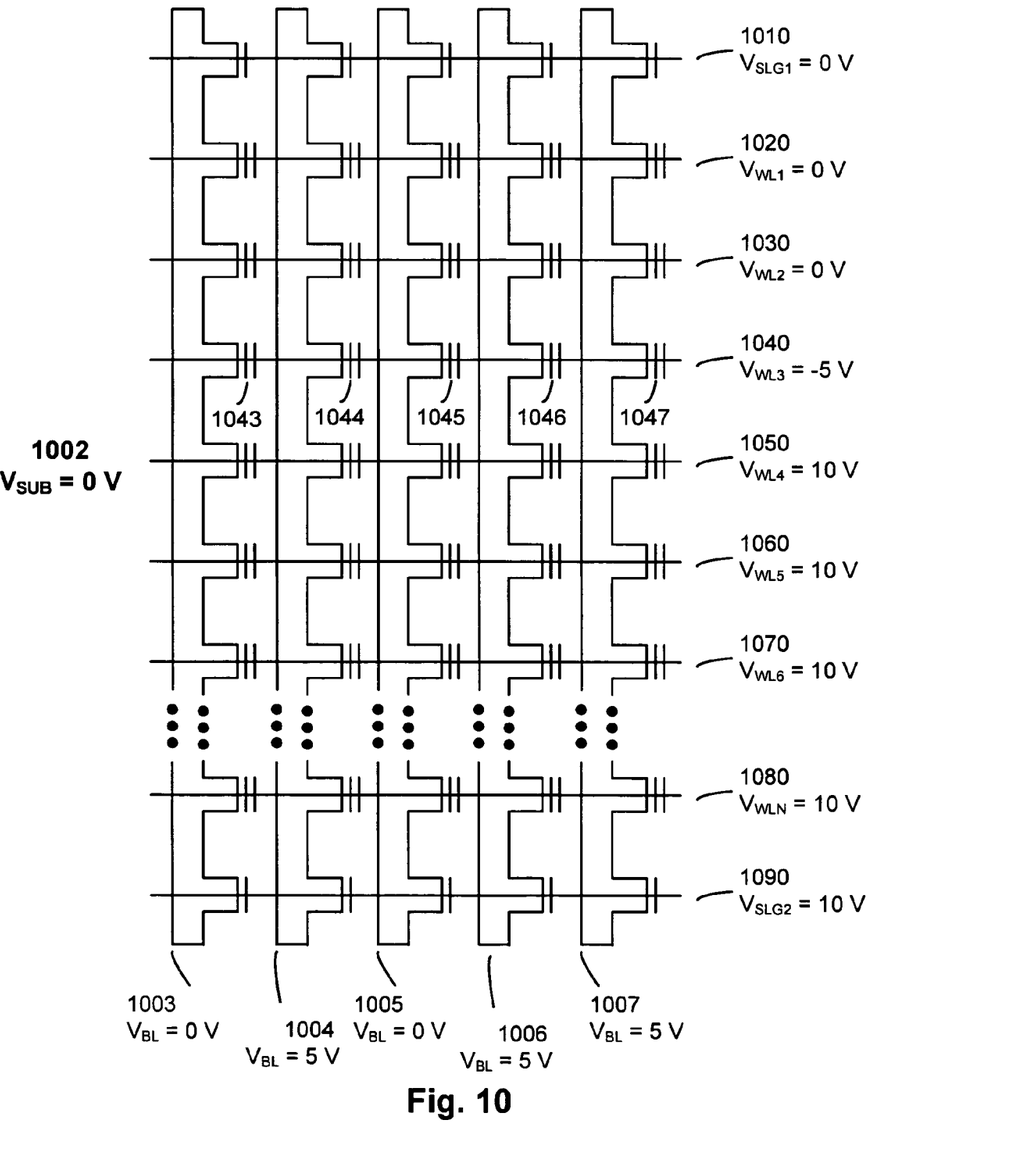
FIG. 10 is a simplified diagram of an array of charge trapping memory cells, showing a program operation being performed on another portion of selected cells of the memory array.

In FIG. 10, several memory cells are programmed similar to FIG. 9. The voltage of the substrate 1002 is 0 V. However, with the memory cells selected by the word line 1040, the charge trapping structure parts 1043, 1044, 1045, 1046, and 1047 are selected by turning on the pass transistor word line 1090 with a voltage of 10 V. The voltages of the intervening memory cell word lines 1050, 1060, 1070, and 1080 is set to 10 V. The other pass transistor word line 1010 and the remaining memory cell word lines 1020 and 1030 are turned off with a voltage of 0 V. Out of the selected charge trapping structure parts 1043, 1044, 1045, 1046, and 1047, the charge trapping structure parts 1044, 1046, and 1047 are programmed by setting the voltages of the bit lines 1004, 1006, and 1007 to 5 V. Out of the selected charge trapping structure parts 1043, 1044, 1045, 1046, and 1047, the charge trapping structure parts 1043 and 1045 are not programmed, by setting the voltages of the bit lines 1003 and 1005 to 0 V.

Figure 11:
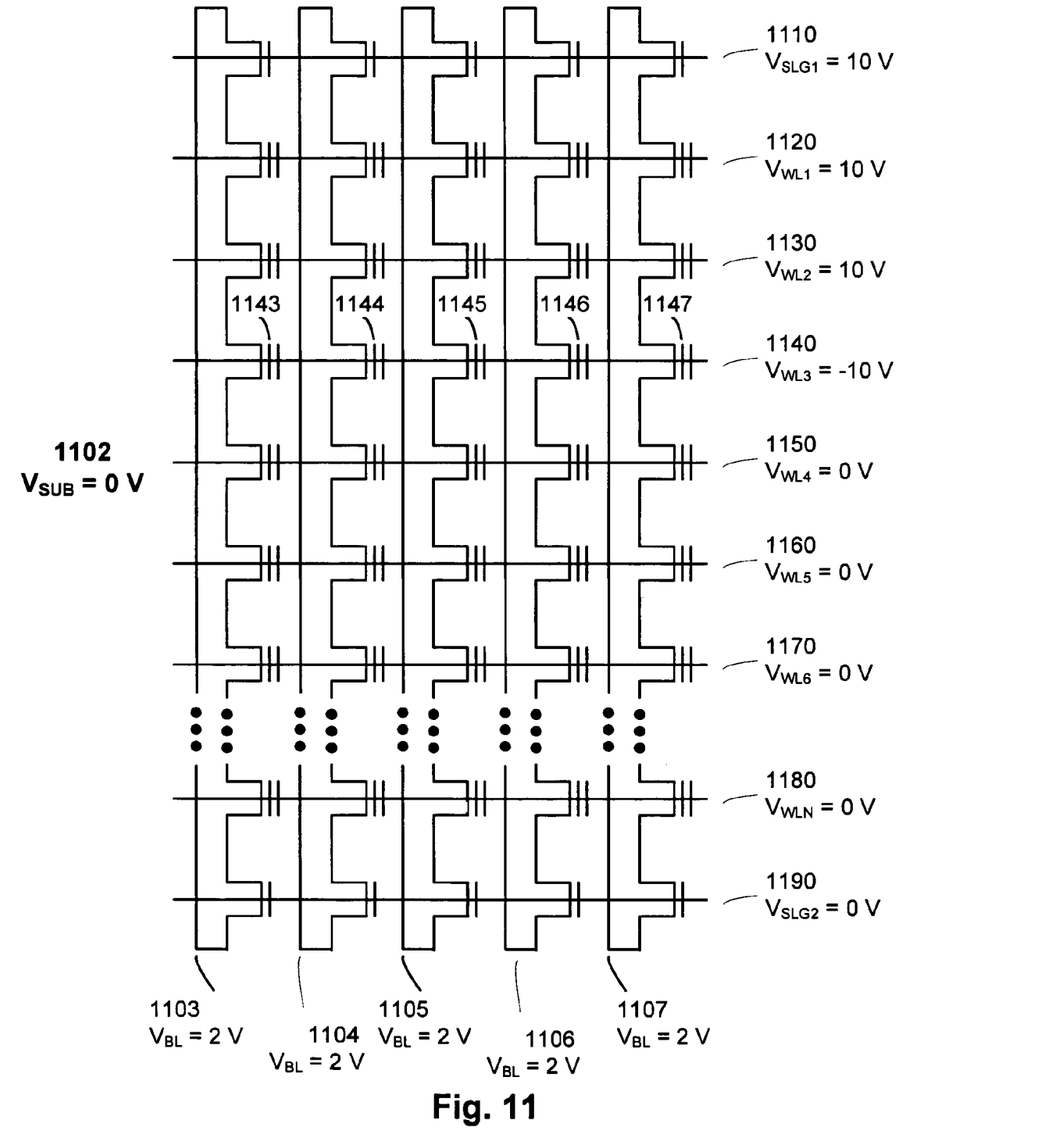
FIG. 11 is a simplified diagram of an array of charge trapping memory cells, showing a read operation being performed on one portion of selected cells of the memory array.

In FIG. 11, several memory cells are read in an array of memory cells with multiple strings each including N memory cells coupled in series. The voltage of the substrate 1102 is 0 V. The word line 1140 of the memory cells to be read has a voltage of −10 V. With the memory cells selected by the word line 1140, the charge trapping structure parts 1143, 1144, 1145, 1146, and 1147 are selected by turning on the pass transistor word line 1110 with a voltage of 10 V. The voltages of the intervening memory cell word lines 1120 and 1130 are set to 10 V. The other pass transistor word line 1190 and the remaining memory cell word lines 1150, 1160, 1170, and 1180 are turned off with a voltage of 0 V. The selected charge trapping structure parts 1143, 1144, 1145, 1146, and 1147, are read by setting the voltages of the bit lines 1103, 1104, 1105, 1106, and 1107 to 2 V. In other embodiments, a subset of all the bit lines are read by setting the voltages to 2 V for only the bit lines of interest.

Figure 12:
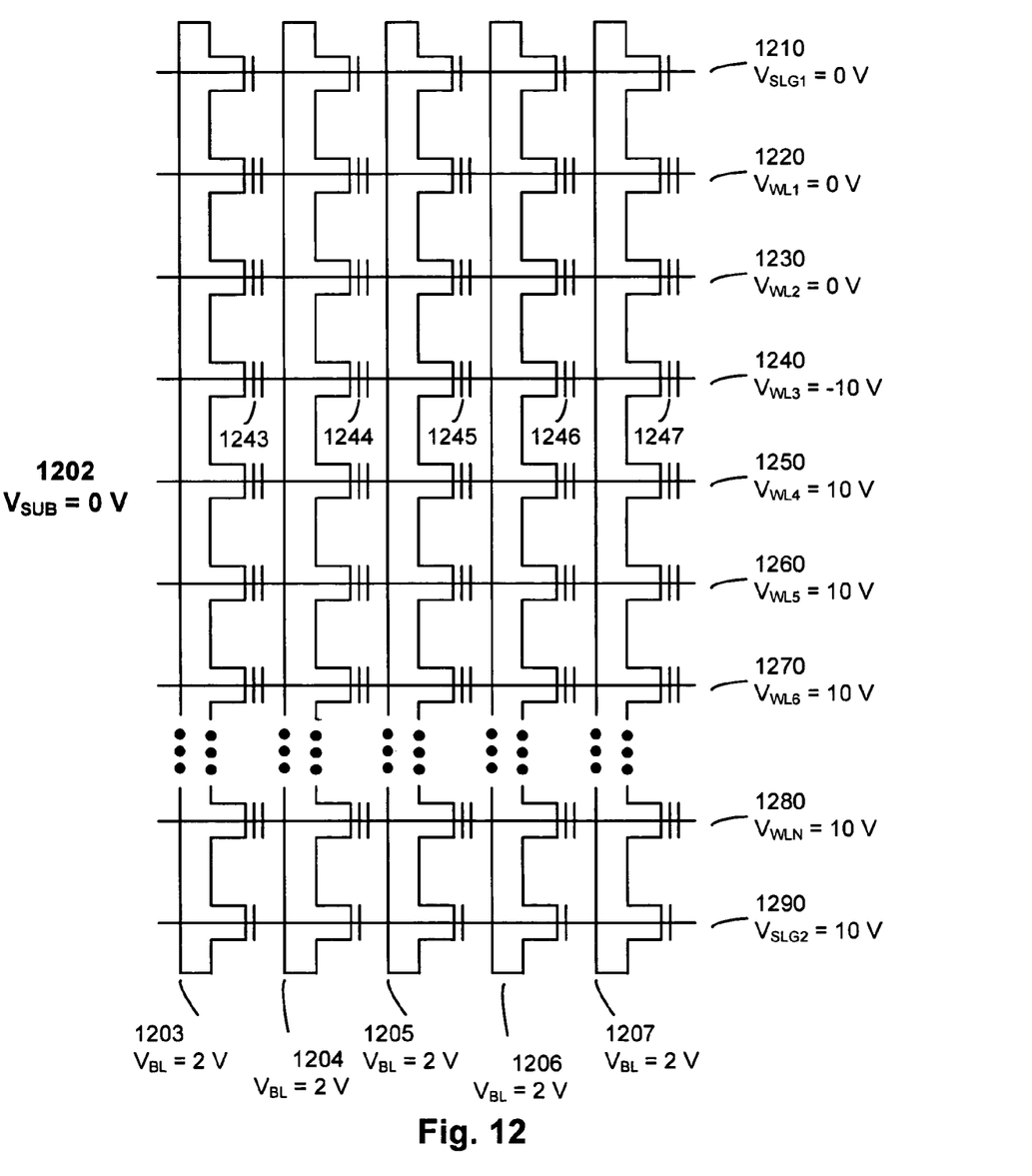
FIG. 12 is a simplified diagram of an array of charge trapping memory cells, showing a read operation being performed on another portion of selected cells of the memory array.

In FIG. 12, several memory cells are read similar to FIG. 11. The voltage of the substrate 1202 is 0 V. However, with the memory cells selected by the word line 1240, the charge trapping structure parts 1243, 1244, 1245, 1246, and 1247 are selected by turning on the pass transistor word line 1290 with a voltage of 10 V. The voltages of the intervening memory cell word lines 1250, 1260, 1270, and 1280 are set to 10 V. The other pass transistor word line 1210 and the remaining memory cell word lines 1220 and 1230 are turned off with a voltage of 0 V. The selected charge trapping structure parts 1243, 1244, 1245, 1246, and 1247, are read by setting the voltages of the bit lines 1203, 1204, 1205, 1206, and 1207 to 2 V. In other embodiments, a subset of all the bit lines are read by setting the voltages to 2 V for only the bit lines of interest.

Figure 13A:
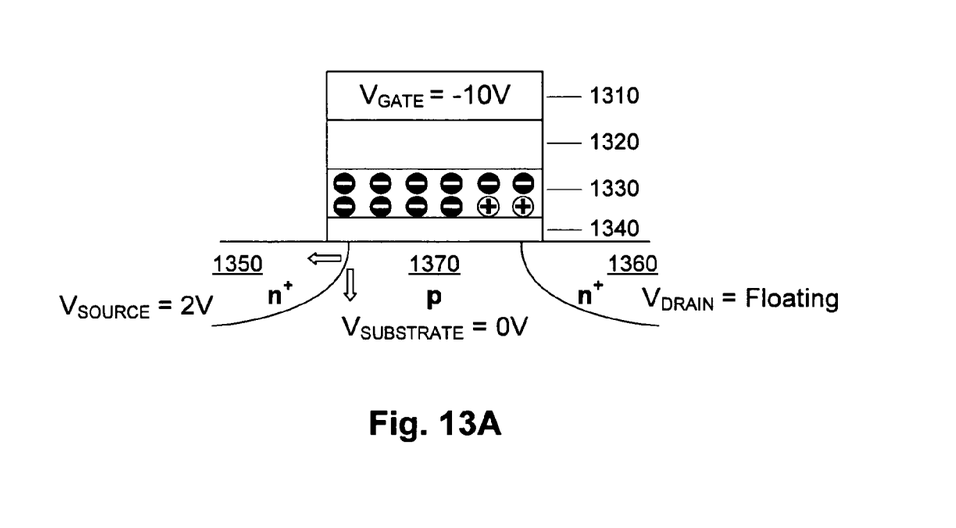
FIG. 13A is a simplified diagram of a charge trapping memory cell, showing a read operation being performed on the portion of the charge trapping structure corresponding to the source side.

FIG. 13A is a simplified diagram of a charge trapping memory cell, showing a read operation being performed on the source side of the charge trapping structure. The p-doped substrate region 1370 includes n+doped source and drain regions 1350 and 1360. The remainder of the memory cell includes a bottom dielectric structure 1340 on the substrate, a charge trapping structure 1330 on the bottom dielectric structure 1340 (bottom oxide), a top dielectric structure 1320 (top oxide) on the charge trapping structure 1330, and a gate 1310 on the oxide structure 1320. Representative top dielectrics include silicon dioxide and silicon oxynitride having a thickness of about 5 to 10 nanometers, or other similar high dielectric constant materials including for example $Al_2O_3$. Representative bottom dielectrics include silicon dioxide and silicon oxynitride having a thickness of about 3 to 10 nanometers, or other similar high dielectric constant materials. Representative charge trapping structures include silicon nitride having a thickness of about 3 to 9 nanometers, or other similar high dielectric constant materials, including metal oxides such as $Al_2O_3$, $HfO_2$, and others. The charge trapping structure may be a discontinuous set of pockets or particles of charge trapping material, or a continuous layer as shown in the drawing.

The memory cell for PHINES-like cells has, for example, a bottom oxide with a thickness ranging from 2 nanometers to 10 nanometers, a charge trapping layer with a thickness ranging from 2 nanometers to 10 nanometers, and a top oxide with a thickness ranging from 2 nanometers to 15 nanometers.

In some embodiments, the gate comprises a material having a work function greater than the intrinsic work function of n-type silicon, or greater than about 4.1 eV, and preferably greater than about 4.25 eV, including for example greater than about 5 eV. Representative gate materials include p-type poly, TiN, Pt, and other high work function metals and materials. Other materials having a relatively high work function suitable for embodiments of the technology include metals including but not limited to Ru, Ir, Ni, and Co, metal alloys including but not limited to Ru-Ti and Ni-T, metal nitrides, and metal oxides including but not limited to $RuO_2$. High work function gate materials result in higher injection barriers for electron tunneling than that of the typical n-type polysilicon gate. The injection barrier for n-type polysilicon gates with silicon dioxide as the top dielectric is around 3.15 eV. Thus, embodiments of the present technology use materials for the gate and for the top dielectric having an injection barrier higher than about 3.15 eV, such as higher than about 3.4 eV, and preferably higher than about 4 eV. For p-type polysilicon gates with silicon dioxide top dielectrics, the injection barrier is about 4.25 eV, and the resulting threshold of a converged cell is reduced about 2 volts relative to a cell having an n-type polysilicon gate with a silicon dioxide top dielectric.

In the diagram of FIG. 13A, the drain side of the memory cell has been programmed, for example via band-to-band hole injection into the drain side of the charge trapping structure 1330. The source side of the memory cell has been erased, for example via a channel reset operation injecting electrons via Fowler-Nordheim tunneling from the gate 1310 to the charge trapping structure 1330, and from the charge trapping structure 1330 to the substrate 1370.

Figure 13B:
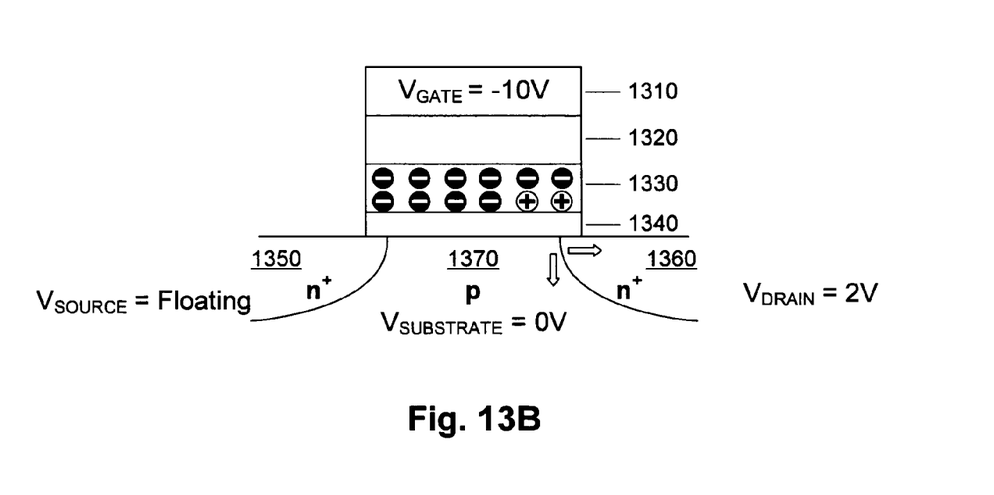
FIG. 13B is a simplified diagram of a charge trapping memory cell, showing a read operation being performed on the portion of the charge trapping structure corresponding to the drain side.

In the bias arrangement of FIG. 13A for reading the source side of the charge trapping structure 1330, the voltage of the gate 1310 is –10 V, the voltage of the source 1350 is 2 V, the voltage of the drain 1360 is floating, and the voltage of the substrate 1370 is 0 V. The memory cell of FIG. 13B is similar to memory cell of FIG. 13A, except that a read operation is being performed on the drain side of the charge trapping structure rather than on the source side. In the bias arrangement of FIG. 13B for reading the drain side of the charge trapping structure 1330, the voltage of the gate 1310 is –10 V, the voltage of the source 1350 is floating, the voltage of the drain 1360 is 2 V, and the voltage of the substrate 1370 is 0 V. The bias arrangement is determined among the various terminals, such that the energy bands bend sufficiently to cause band-to-band current in the n+ doped source 1350 (FIG. 13A) or the n+ doped drain 1360 (FIG. 13B), but to keep the potential difference between the substrate 1370 and the source 1350 (FIG. 13A) or the drain 1360 (FIG. 13B) low enough such that programming does not occur, as discussed in connection with FIG. 2A.

In this bias arrangements of FIGS. 13A and 13B, the area of the junction between the p doped substrate 1370, and either the n+ doped source 1350 or the n+ doped drain 1360, and displays the behavior of a reverse biased p-n junction. However, the gate voltage causes the energy bands to bend sufficiently such that band-to-band tunneling occurs in the n+ doped source 1350 (FIG. 13A) or the n+ doped drain 1360 (FIG. 13B). The high doping concentration in the source 1350 or the drain 1360, the resulting high charge density of the space charge region, and the accompanying short length of the space charge region over which the voltage changes, contribute to the sharp energy band bending. Electrons in the valence band tunnel through the forbidden gap to the conduction band and drift down the potential hill, deeper into either the n+ doped source 1350 (FIG. 13A) or the n+ doped drain 1360 (FIG. 13B). Similarly, holes drift up the potential hill, away from either the n+ doped source 1350 (FIG. 13A) or the n+ doped drain 1360 (FIG. 13B), and toward the p doped substrate 1370.

The voltage of the gate 1310 controls the voltage of the portion of the substrate 1370 by the bottom dielectric structure 1340 (bottom oxide). In turn, the voltage of the portion of the substrate 1370 by the bottom dielectric structure 1340 (bottom oxide) controls the degree of band bending between the bottom dielectric structure 1340 (bottom oxide), and either the n+ doped source 1350 (FIG. 13A) or the n+ doped drain 1360 (FIG. 13B). As the voltage of the gate 1310 becomes more negative, the voltage of the portion of the substrate 1370 by the bottom dielectric structure 1340 (bottom oxide) becomes more negative, resulting in deeper band bending in either the n+ doped source 1350 (FIG. 13A) or the n+ doped drain 1360 (FIG. 13B). More band-to-band current flows, as a result of at least some combination of 1) an increasing overlap between occupied electron energy levels on one side of the bending energy bands, and unoccupied electron energy levels on the other side of bending energy bands, and 2) a narrower barrier width between the occupied electron energy levels and the unoccupied electron energy levels (Sze, *Physics of semiconductor Devices*, 1981).

As mentioned above, the drain side of the charge trapping structure 1330 is programmed and occupied by holes, whereas the source side of the charge trapping structure 1330 is erased and occupied by fewer holes than the drain side of the charge trapping structure 1330. As a result, in accordance with Gauss' Law, when –10 V is applied to the gate 1310, the bottom dielectric structure 1340 (bottom oxide) is biased more negatively on the source side than on the drain side. Thus, more current flows between the source 1350 and the substrate 1370 in the bias arrangement shown in FIG. 13A for reading the source side of the charge trapping structure 1330 than flows between the drain 1360 and the substrate 1370 in the bias arrangement shown in FIG. 13B for reading the drain side of the charge trapping structure 1330.

The difference in the bias arrangements of FIGS. 13A and 13B for reading, and bias arrangement for programming, show a careful balance. For reading, the potential difference between the source region or the drain region should not cause a substantial number of carriers to transit the tunnel oxide and affect the charge storage state. In contrast, for programming, the potential difference between the source region or the drain region is sufficient to cause a substantial number of carriers to transit the tunnel oxide and affect the charge storage state.

Figure 14A:
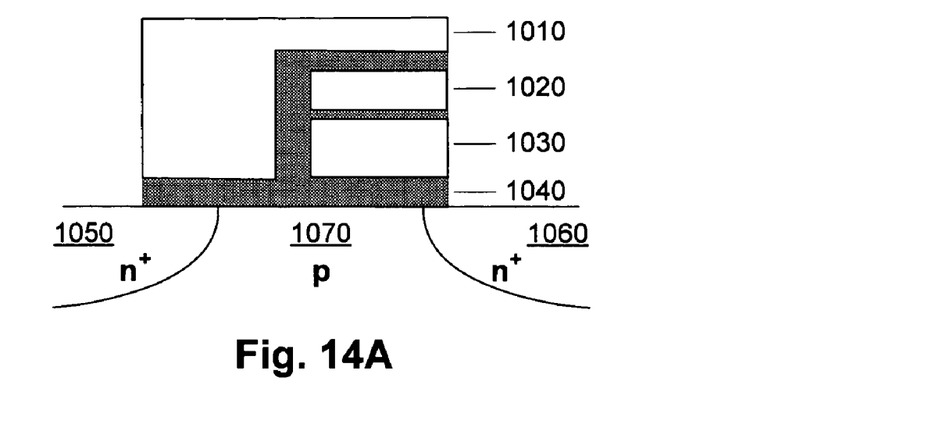
FIGS. 14A-14C are simplified diagrams of other nonvolatile memory cells with various charge storage structures.
Figure 14B:
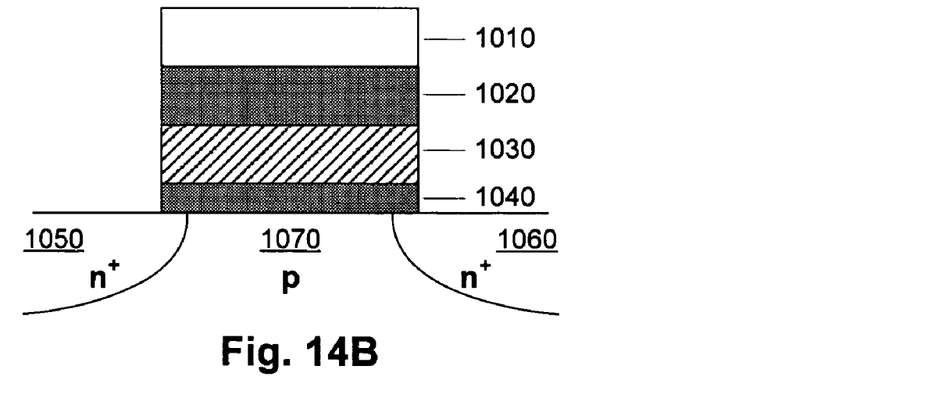
Figure 14C:
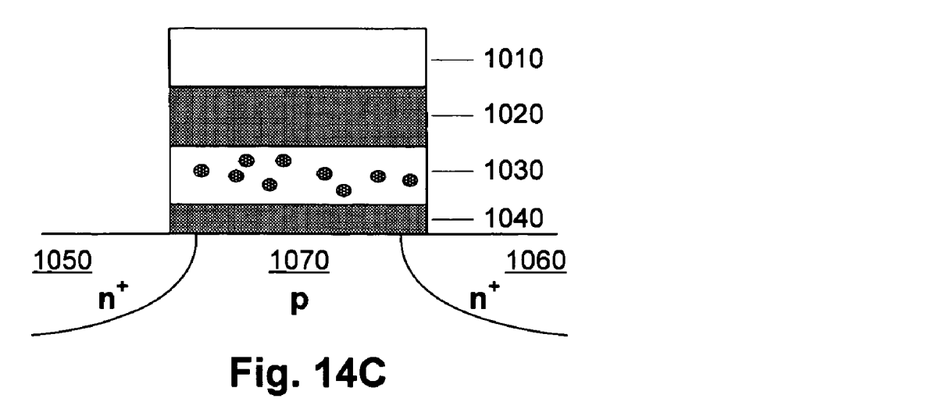

FIGS. 14A-14C show simplified diagrams of other nonvolatile memory cells with various charge storage structures. FIG. 14A shows the structure of a split gate memory cell, with a first gate 1020, a second gate 1010, a charge storage structure 1030, and oxide 1040. FIG. 14B shows a nonvolatile memory cell resembling the nonvolatile memory cell of FIG. 14A, but with a floating gate 1030, often made of polysilicon. FIG. 14C shows a nonvolatile memory cell resembling the nonvolatile memory cell of FIG. 14A, but with a nanoparticle charge storage structure 1030.

Figure 15:
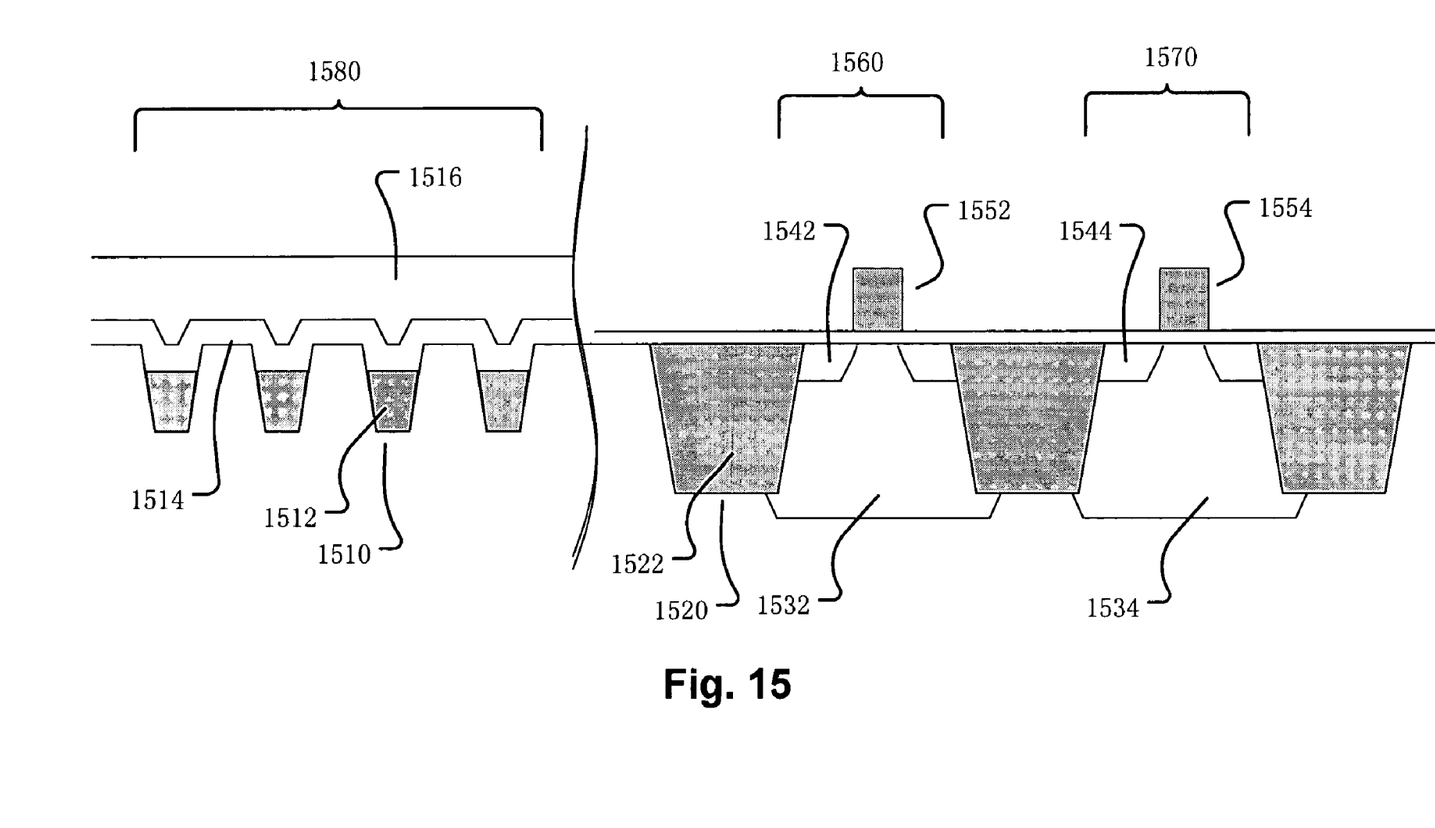
FIG. 15 is a simplified diagram of memory circuitry and control circuitry with different shallow trench isolation structures sharing a common substrate.

FIG. 15 is a simplified diagram of memory circuitry and control circuitry with different shallow trench isolation structures sharing a common substrate. In particular, the same substrate is shared by memory circuitry 1580, and control circuitry which includes n-type transistor 1560 and p-type transistor 1570. The memory circuitry 1580 has shallow trench isolation structures with trenches 1510 filled incompletely by isolation oxide 1520. Memory devices are formed by memory structure 1514, which partly fills the trenches 1510. The word line material 1516 which provides a gate voltage to the memory devices overlies the memory structure 1514. The control circuitry has shallow trench isolation structures with trenches 1520 filled completely by isolation oxide 1522. The n-type transistor 1560 is formed in p-well 1532, and has n+ source and drain 1542 and n+ gate 1552. The p-type transistor 1570 is formed in n-well 1534, and has p+ source and drain 1544 and p+ gate 1554.

Figure 16:
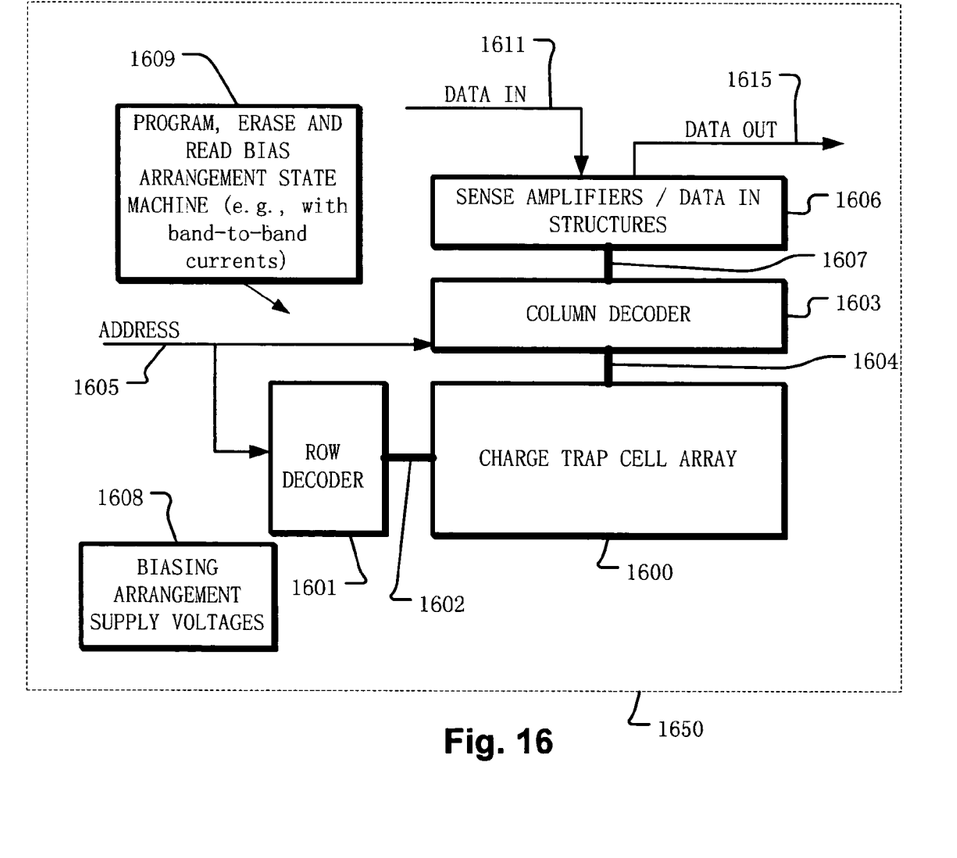
FIG. 16 is a simplified diagram of an integrated circuit with an array of charge trapping memory cells and control circuitry.

FIG. 16 is a simplified block diagram of an integrated circuit according to an embodiment. The integrated circuit 1650 includes a memory array 1600 implemented using charge trapping memory cells, on a semiconductor substrate. The devices of the integrated circuit 1650 are separated by a recessed shallow trench isolation, in one embodiment. In another embodiment, devices of the remaining circuitry are separated by shallow trench isolation structures having comparatively shallower recess, or no recess. A row decoder 1601 is coupled to a plurality of word lines 1602 arranged along rows in the memory array 1600. A column decoder 1603 is coupled to a plurality of bit lines 1604 arranged along columns in the memory array 1600. Addresses are supplied on bus 1605 to column decoder 1603 and row decoder 1601. Sense amplifiers and data-in structures in block 1606 are coupled to the column decoder 1603 via data bus 1607. Data is supplied via the data-in line 1611 from input/output ports on the integrated circuit 1650, or from other data sources internal or external to the integrated circuit 1650, to the data-in structures in block 1606. Data is supplied via the data-out line 1615 from the sense amplifiers in block 1606 to input/output ports on the integrated circuit 1650, or to other data destinations internal or external to the integrated circuit 1650. A bias arrangement state machine 1609 controls the application of bias arrangement supply voltages 1608, such as for the erase verify and program verify voltages, and the arrangements for programming, erasing, and reading the memory cells, such as with the band-to-band currents.

While the present invention is disclosed by reference to the technology and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory integrated circuit, comprising:
  memory circuitry including memory circuitry trenches, including:
    first shallow trench isolation structures including first isolation dielectric, the first isolation dielectric filling the memory circuitry trenches incompletely, the memory circuitry trenches characterized a first trench depth between top edge to bottom; and
  control circuitry coupled to the memory circuitry, the control circuitry including control circuitry trenches, including:
    second shallow trench isolation structures including second isolation dielectric, the second isolation dielectric filling the control circuitry trenches more completely than the first isolation dielectric fills the memory circuitry trenches, the control circuitry trenches characterized a second trench depth between top edge to bottom, the second trench depth having a magnitude larger than the first trench depth.

2. The circuit of claim 1 wherein the second isolation dielectric fills the control circuitry trenches more completely than the first isolation dielectric fills the memory circuitry trenches, such that the second isolation dielectric fills the control circuitry trenches completely.

3. The circuit of claim 1
  wherein the second isolation dielectric fills the control circuitry trenches more completely than the first isolation dielectric fills the memory circuitry trenches, such that a first percentage of the memory circuitry trenches is filled by the first isolation dielectric, a second percentage of the control circuitry trenches is filled by the second isolation dielectric, and the second percentage is larger than the first percentage.

4. The circuit of claim 1 wherein the memory circuitry further includes:
  nonvolatile memory structures, including:
    charge storage structures;
    one or more dielectric structures at least partly between the charge storage structures and the substrate region and at least partly between the charge storage structures and sources of gate voltage; and
    the sources of gate voltage,
    wherein the nonvolatile memory structures at least partly fill the memory circuitry trenches.

5. The circuit of claim 1 wherein the memory circuitry further includes:
  strings of nonvolatile memory structures, including:
    charge storage structures;
    one or more dielectric structures at least partly between the charge storage structures and the substrate region and at least partly between the charge storage structures and sources of gate voltage; and
    the sources of gate voltage,
    wherein the nonvolatile memory structures at least partly fill the memory circuitry trenches.

6. The circuit of claim 1 wherein the memory circuitry further includes nonvolatile memory structures forming nonvolatile memory devices, and
  wherein the control circuitry induces a band-to-band current component in the memory devices to read data in the memory devices.

7. The circuit of claim 1 wherein the memory circuitry further includes nonvolatile memory structures forming nonvolatile memory devices, and
  wherein the control circuitry measures a current component flowing between a substrate region and a current terminal in the memory devices to read data in the memory devices.

8. The circuit of claim 1 wherein top edges of said memory circuit trenches of the first shallow trench isolation structures are tapered.

9. The circuit of claim 1 wherein top edges of said memory circuit trenches of the first shallow trench isolation structures are rounded.

10. A memory integrated circuit, comprising:

memory circuitry including memory circuitry trenches, including:

shallow trench isolation structures oriented along a direction of a substrate, the shallow trench isolation structures including first isolation dielectric, the first isolation dielectric filling the memory circuitry trenches incompletely, the memory circuitry trenches characterized a first trench depth between top edge to bottom;

intermediate regions between the memory circuitry trenches, the intermediate regions oriented along the direction of the substrate, the intermediate regions including:

nonvolatile memory structures forming nonvolatile memory devices, each including:

a charge storage structure; and one or more dielectric structures at least partly between the charge storage structure and the substrate region and at least partly between the charge storage structure and a source of gate voltage, wherein the memory circuitry supports a channel between neighboring nonvolatile memory devices sharing a common one of said intermediate regions, the channel supporting a first current component having a first orientation defined by a trench of at least one shallow trench isolation structure adjacent to the common intermediate region, and a second current component having a second orientation defined by a surface of the common intermediate region; and control circuitry coupled to the memory circuitry, including:

second shallow trench isolation structures including second isolation dielectric, the second isolation dielectric at least partly filling the control circuitry trenches, the control circuitry trenches characterized a second trench depth between top edge to bottom, the second trench depth having a magnitude larger than the first trench depth.

11. The circuit of claim 10, wherein the control circuitry supports a channel between neighboring control devices supporting a current component having a single orientation.

12. The circuit of claim 10 wherein the nonvolatile memory structures form strings of nonvolatile memory devices.

13. The circuit of claim 10 wherein the nonvolatile memory structures form strings of nonvolatile memory devices.

14. The circuit of claim 10 wherein the control circuitry induces a band-to-band current component in the nonvolatile memory devices formed by the nonvolatile memory structures to read data in the nonvolatile memory devices.

15. The circuit of claim 10 wherein the control circuitry measures a current component flowing between a substrate region and a current terminal in the nonvolatile memory devices formed by the nonvolatile memory structures to read data in the nonvolatile memory devices.

16. The circuit of claim 10 wherein top edges of said memory circuit trenches of the shallow trench isolation structures are tapered.

17. The circuit of claim 10 wherein top edges of said memory circuit trenches of the shallow trench isolation structures are rounded.

* * * * *

UNITED STATES PATENT AND TRADEMARK OFFICE
CERTIFICATE OF CORRECTION

| | | |
|---|---|---|
| PATENT NO. | : 7,514,742 B2 | Page 1 of 1 |
| APPLICATION NO. | : 11/249228 | |
| DATED | : April 7, 2009 | |
| INVENTOR(S) | : Chi Chieh Yeh | |

It is certified that error appears in the above-identified patent and that said Letters Patent is hereby corrected as shown below:

On the cover page,

[*] Notice: Subject to any disclaimer, the term of this patent is extended or adjusted under 35 USC 154(b) by (418) days Delete the phrase "by 418 days" and insert -- by 594 days --

Signed and Sealed this

Thirteenth Day of April, 2010

David J. Kappos
*Director of the United States Patent and Trademark Office*